(12) United States Patent
Savell

(10) Patent No.: US 6,226,661 B1
(45) Date of Patent: May 1, 2001

(54) GENERATION AND APPLICATION OF SAMPLE RATE CONVERSION RATIOS USING DISTRIBUTED JITTER

(75) Inventor: Thomas C. Savell, Santa Cruz, CA (US)

(73) Assignee: Creative Technology Ltd., Singapore (SG)

( * ) Notice: Subject to any disclaimer, the term of this patent is extended or adjusted under 35 U.S.C. 154(b) by 0 days.

(21) Appl. No.: 09/192,045

(22) Filed: Nov. 13, 1998

(51) Int. Cl.$^7$ .................................................. G06F 17/17
(52) U.S. Cl. ............................................. 708/313; 341/61
(58) Field of Search ................................ 708/313; 341/61

(56) References Cited

U.S. PATENT DOCUMENTS

| | | | |
|---|---|---|---|
| 5,376,752 | 12/1994 | Limberis et al. | 84/622 |
| 5,559,513 | * 9/1996 | Rothermel et al. | 708/313 |
| 5,600,320 | * 2/1997 | Wilson et al. | 341/61 |
| 5,666,299 | 9/1997 | Adams et al. | 364/724.011 |
| 5,903,482 | * 5/1999 | Iwamura et al. | 708/313 |
| 6,005,901 | * 12/1999 | Linz | 341/61 |
| 6,057,789 | * 5/2000 | Lin | 341/61 |
| 6,061,410 | * 5/2000 | Linz | 341/61 |

OTHER PUBLICATIONS

Julius O. Smith et al., "A Flexible Sampling–Rate Conversion Method," IEEE International Conference on Acoustics, Speech, and Signal Processing, Mar. 1984, cover plus pp. 19.4.1–19.4.4.

* cited by examiner

Primary Examiner—Tan V. Mai
(74) Attorney, Agent, or Firm—Townsend and Townsend and Crew LLP

(57) ABSTRACT

Methods and circuits for the generation and application of sample rate conversion ratios using distributed jitter. In some applications, it is not possible to represent the required sample rate conversion ratio with an exact fractional binary ratio having a denominator that is a power of two. When this occurs, a fractional binary ratio is selected that approximates the required conversion ratio. The residual phase error resulting from the use of the selected fractional binary ratio is then computed and compensated for by adding a predetermined amount of "jitter." The jitter can be distributed periodically, uniformly, or randomly over each repetition period, the period between which the input and output clock pattern repeats.

24 Claims, 4 Drawing Sheets

GENERATION AND APPLICATION OF SAMPLE RATE CONVERSION RATIOS USING DISTRIBUTED JITTER

BACKGROUND OF THE INVENTION

The present invention relates generally to digital signal processing, and more particularly to generation and application of sample rate conversion ratios using distributed jitter.

Digital signal processing (DSP) is widely used to perform a variety of functions, such as filtering, compression, enhancement, and others. Generally, an analog signal is preprocessed and sampled at a particular sampling frequency using an analog-to-digital converter (ADC). The sampled data can be subsequently processed using various DSP techniques known in the art.

Sample rate conversion generally refers to the process of converting samples at one rate to samples at a second rate. A sample rate conversion ratio refers to the ratio of the input sample rate to the output sample rate. Sample rate conversion may be necessitated, for example, by the need to support multiple industry standards. As an example, for digital audio, many sources are sampled at a sample rate of either 48.0 KHz or 44.1 KHz. It may subsequently be necessary to process data that has been sampled at one rate (e.g., 48.0 KHz) to generate resampled data at a second rate (e.g., 44.1 KHz). For this example, the sample rate conversion ratio is 48.0/44.1, or 160/147 (which is the lowest common denominator for 48,000/44,100).

Often times, for ease of processing, it is desirable to represent the sample rate conversion ratio as a "fractional binary ratio" having a denominator that is a power of two (e.g., 16,384 or $2^{14}$). However, as illustrated by the example above, the sample rate conversion ratios for some applications cannot be exactly represented with fractional binary ratios. When this occurs, one conventional technique simply approximates the sample rate conversion ratio with a nearly equivalent fractional binary ratio, and ignores the resulting error. For the example described above, a fractional binary value of 17832/16384 can be used to approximate 160/147, with a resulting error of 136/(16384·160). However, this technique is inadequate for applications that require precise sample rate conversion ratios.

SUMMARY OF THE INVENTION

The invention provides methods and circuits for the generation and application of sample rate conversion ratios using distributed jitter. In some applications, it is not possible to represent the required sample rate conversion ratio with an exact fractional binary ratio having a denominator that is a power of two. When this occurs, a fractional binary ratio is selected that closely approximates the required conversion ratio. The residual phase error resulting from the use of the selected fractional binary ratio is compensated for by adding a predetermined amount of "jitter." The jitter can be distributed periodically, uniformly, or randomly over each repetition period (i.e., the period in which the input and output clock "pattern" repeats).

A specific embodiment of the invention provides a method for generating a sample rate conversion ratio. Initially, a least common denominator ratio for an input sample rate and an output sample rate is determined. A fractional binary ratio having a denominator that is a power of two is then selected. A residual phase error resulting from using the selected fractional binary ratio is computed. The magnitude and distribution of a phase correction jitter that accounts for the residual phase error is then determined.

Another specific embodiment of the invention provides a method for generating phases for a sample rate converter. Initially, a fractional binary ratio is selected that has a denominator that is a power of two. The fractional binary ratio represents an approximation of a required sample rate conversion ratio. Next, a residual phase error resulting from the use of the selected fractional binary ratio is computed. A base increment value is then determined in accordance with the selected fractional binary ratio, and a fractional increment value corresponding to the residual phase error is also determined. The base increment value is used to update a phase accumulator for each cycle of an output clock. A jitter corresponding to the fractional increment value is added to the phase accumulator for selected cycles of the output clock.

Yet another specific embodiment of the invention provides a method for performing a sample rate conversion. Initially, a base increment value is determined in accordance with a fractional binary ratio that approximates a required sample rate conversion ratio. Next, a fractional increment value is determined based on a computed residual phase error. For each output clock cycle, a phase value is generated in accordance with the base and fractional increment values. Sampled data are then interpolated, in part, in accordance with the generated phase value. Selected ones of the interpolated samples are provided as the output data.

The invention also provides circuits that implements the specific embodiments described above and other embodiments of the invention as described below.

The foregoing, together with other aspects of this invention, will become more apparent when referring to the following specification, claims, and accompanying drawings.

DESCRIPTION OF THE SPECIFIC EMBODIMENTS

Figure 1:
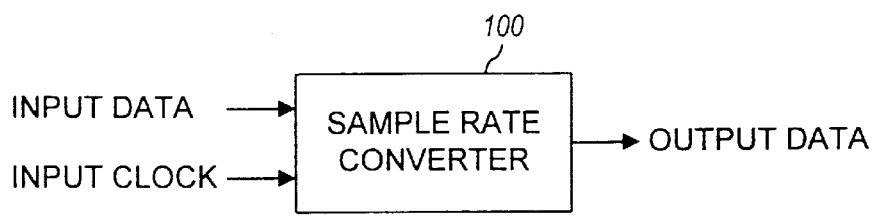
FIG. 1 shows a simple diagram of a sample rate converter.

FIG. 1 shows a simple diagram of a sample rate converter 100 that receives input data and an input clock and provides corresponding output data. The input data is sampled at a first sample rate. The frequency of the input clock is related to the sample rate and can be equal to, or an integer multiple of, the first sample rate. Sample rate converter 100 generates new samples at a second sample rate. The new samples are based on the input samples, the selected sample rate conversion ratio, the input clock, and the type of interpolator used within sample rate converter 100. The sample rate conversion ratio is the ratio of the input sample rate to the output sample rate, and is typically defined by system requirements. The sample rate conversion ratio can be static (e.g., 48.0 KHz/44.1 KHz) or dynamically changing. The new samples are provided as the output data.

Figure 2:
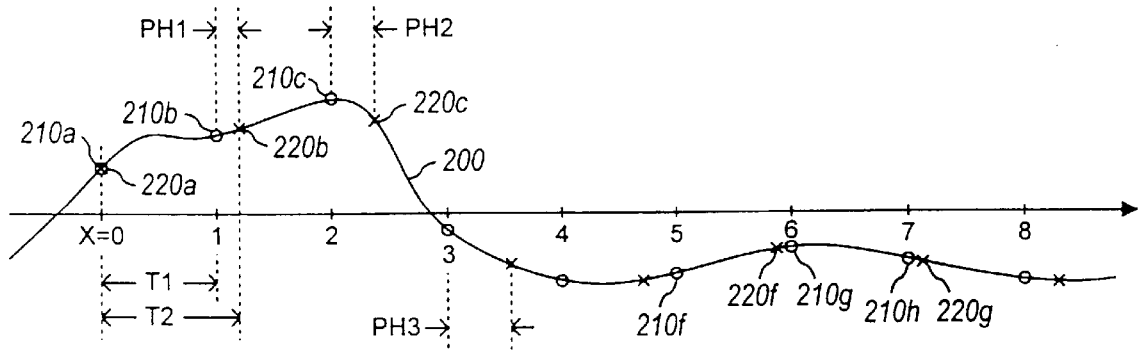
FIG. 2 illustrates the sample rate conversion process.

FIG. 2 illustrates the sample rate conversion process. An input signal 200 is sampled at the first sample rate to generate input samples 210 that are represented by the "o" on input signal 200. Input samples 210 are "resampled" at a second sample rate to generate output samples 220 that are represented by the "x" on input signal 200. Initially, the first input sample 210a is provided as the first output sample 220a. To generate subsequent output samples 220, the phase difference (PH) between a particular input sample 210 and its corresponding output sample 220 is determined. For example, $PH_1$ is the phase difference between input sample 210b and output sample 220b, $PH_2$ is the phase difference between input sample 210c and output sample 220c, and so on. The phase difference is used by the interpolator within the sample rate converter to compute the value of the output sample. Sample rate conversion is also described by J. O. Smith and P. Gossett in "A Flexible Sampling-Rate Conversion Method," IEEE International Conference On Acoustics, Speech, and Signal Processing, March 1984, pp. 19.4.1–19.4.4, which is also incorporated herein by reference.

Figure 3:
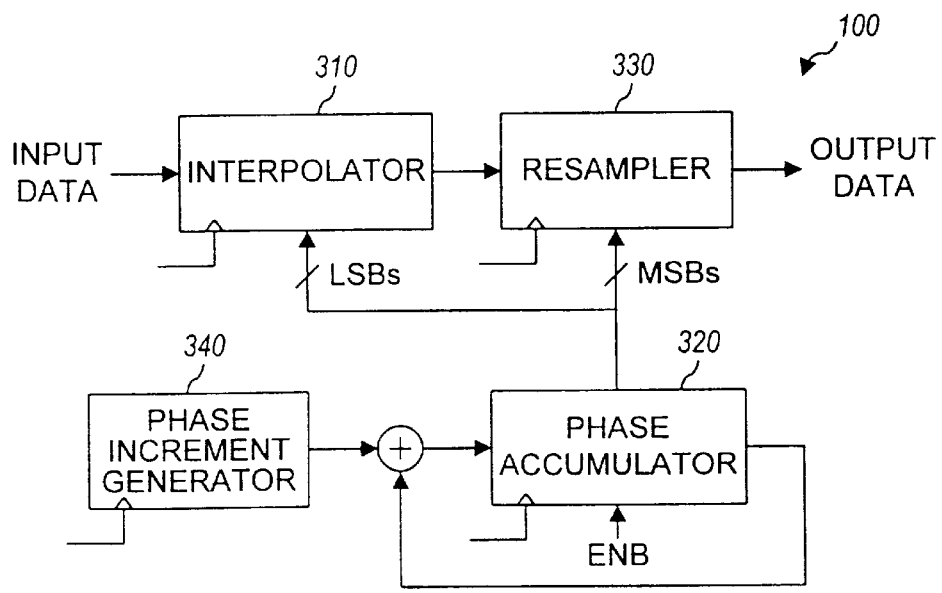
FIG. 3 shows a block diagram of an embodiment of the sample rate converter.

FIG. 3 shows a block diagram of an embodiment of sample rate converter 100. The input data is provided to an interpolator 310 that also receives the phase information (i.e., the phase difference (PH) as described above) from a phase accumulator 320. For each cycle of the input clock, interpolator 310 generates an interpolated sample based on two or more input samples (depending on the type of interpolator used) and the phase information from phase accumulator 320. The interpolated samples are provided to a resampler 330 that provides selected ones of the interpolated samples as the output data.

An embodiment of interpolator 310 is described in detail in U.S. patent application Ser. No. 08/968,601, entitled "ASYNCHRONOUS SAMPLE RATE TRACKER," filed Nov. 13, 1997, assigned to the assignee of the present invention, and incorporated herein by reference. Example of another interpolator is described in U.S. Pat. No. 5,666,299, entitled "ASYNCHRONOUS DIGITAL SAMPLE RATE CONVERTER," issued to Adams et al. on Sep. 13, 1997, and incorporated herein by reference. Interpolator 310 can also be a synthesizer (e.g., a voice or a music synthesizer), such as one described in U.S. Pat. No. 5,376,752, entitled "OPEN ARCHITECTURE MUSIC SYNTHESIZER WITH DYNAMIC VOICE ALLOCATION," issued to Limberis et al. on Dec. 27, 1994, and incorporated herein by reference.

Referring back to FIG. 2, when resampling to a lower output sample rate, some input samples have no corresponding output samples. For example, output sample 220f generally corresponds to input sample 210f and output sample 220g generally corresponds to input sample 210h. However, there is no output sample corresponding to input sample 210g. For input samples having no corresponding output samples, such as sample 210g, resampler 330 withholds the interpolated samples corresponding to these input samples from the output data.

Phase accumulator 320 provides the phase information (e.g., $PH_1$, $PH_2$, $PH_3$, and so on) that is used by interpolator 310 to generate interpolated samples. As shown in FIG. 2, the sample rates of the input data and output data can be represented by sample periods T1 and T2, respectively. The phase of the output samples (i.e., relative to the phase of the input samples) can be obtained by accumulating the output sample period T2 for each output clock cycle. The phase can also be obtained by accumulating the output sample period T2 for each input clock cycle, and skipping some input clock cycles, when appropriate, as indicated by an enable control signal (ENB) that is described in further detail below.

By representing the input sample period T1 with a value that is a power of two (e.g., $2^n$, where n is an integer), the phase generation can be simplified. With each cycle the output clock signal, a phase increment value corresponding to T2 is added to the phase accumulator. Since T1 is selected to be a power of two, the phase difference (PH) is a value between 0 and $2^n-1$. This indicates that the phase accumulator can be allowed to "wrap around" during phase accumulation and that only n least significant bits (LSBs) of the accumulator is needed to represent the phase difference.

As an example, consider a case wherein the input sample rate is 48.0 KHz and the output sample rate is 44.1 KHz. The sample rate conversion ratio equals 48.0/44.1 and the least common denominator ratio is 160/147. The ratio 160/147 cannot be exactly represented by a fractional binary ratio, but can by approximated as, for example, by a fractional binary ratio of 17832/16384. Since 16384 is equal to $2^{14}$, an accumulator having fifteen or more bits can be used. With each cycle of the 44.1 KHz clock, a base increment value of 17832 is added to the accumulator. The value in the fourteen LSBs in the accumulator represents the phase difference between an output sample and its corresponding input sample.

In the above example, the ratio 17832/16384 is not exactly equal to the required ratio 160/147. In fact, the ratio 17832/16384 equals 1.08837890625 and the required ratio 160/147 equals 1.08843537415. To generate a ratio that is exactly equal to 160/147, a predetermined amount of "jitter" is added to the accumulator.

The required amount of jitter is dependent on a residual phase error for one "repetition period" between the input and output sample rates. The repetition period is the shortest period in which the input and output clock "pattern" repeats, which is also the period in which the input and output clocks are exactly aligned in phase. For the above example, the duration of 160 cycles of the 48.0 KHz clock is exactly equal to that of 147 cycles of the 44.1 KHz clock. This duration is the repetition period of the two clocks.

Using 16384 as the period of one cycle of the 48.0 KHz clock, the repetition period can be computed as 160·16384, or 2621440. However, by adding 17832 to the accumulator for each of the 147 clock cycles of the 44.1 KHz clock, the accumulator (if implemented with enough resolution) would only contain 2621304. The residual phase error is the difference between the value that should have been accumulated (e.g., 2621440) and the value that is actually accumulated without jitter correction (e.g., 2621304), and is equal to 136 for the above example. Thus, besides adding the base increment value of 17832 to the accumulator for each cycle of the 44.1 KHz clock, an additional value of 136 is added to the accumulator for each repetition period (e.g., for each 147 cycles of the 44.1 KHz clock, or for each 160 cycles of the 48.0 KHz clock). This value of 136 represents the total jitter that is added to the phase accumulator for each repetition period in order to generate an exact sample rate conversion ratio. The value of 136/147 is referred to as a fractional increment value.

To minimize the effects of the jitter, the amount of jitter added on any given clock cycle can be limited to a predetermined value. For example, the jitter amplitude can be limited to one LSB of the phase accumulator. However, jitter amplitude greater than one LSB can also be added and is within the scope of the invention.

The residual phase error for each repetition period can be accounted for by adding one LSB of jitter periodically, uniformly, or randomly over the repetition period. For the above example, one LSB of jitter is added to the phase accumulator (in addition to the base increment value of 17832) for 136 out of every 147 output clock cycles. The jitter to account for the residual phase error can be added in various manners.

In one embodiment, one LSB is added for the first 136 cycles of each repetition period (or 136 out of 147 output clock cycles). This embodiment is simple to implement but can result in a large phase error (relative to other embodiments described below) in the output clock.

In another embodiment, one LSB is periodically or uniformly added throughout the repetition period. For the above example, adding one LSB for 136 out of 147 output clock cycles is equivalent to not adding an LSB for 11 out of 147 clock cycles. Since 147/11 is equal to 13+(or 13 with a remainder of four since 11·13=143), approximately one out of every 13 samples does not need one LSB added to the base increment value. The remainder of four can be accounted for via addition of one LSB to the base increment value for four additional output clock cycles during each repetition period. Thus, each repetition period includes ten instances where there are 13 cycles between the omission of one LSB of jitter, and one instance where there are 17 cycles between the omission of one LSB of jitter. Alternatively, each repetition period can include seven instances where there are 13 cycles between the omission of one LSB of jitter, and four instance where there are 14 cycles between the omission of one LSB of jitter. The jitter can also be distributed in various other manners.

In yet another embodiment, the jitter is randomly (or pseudo-randomly) distributed within the repetition period to minimize spurious tones in the output clock. For example, if one LSB of jitter is added for every five output clock cycles, a spurious tone would appear in the output clock at one fifth of the output clock rate. The spurious tone can, in some applications, cause degradation in the performance of the system. By randomizing the placement of the LSBs, the spurious tone can be minimized or reduced. Random distribution of the jitter is further described below.

Figure 4A:
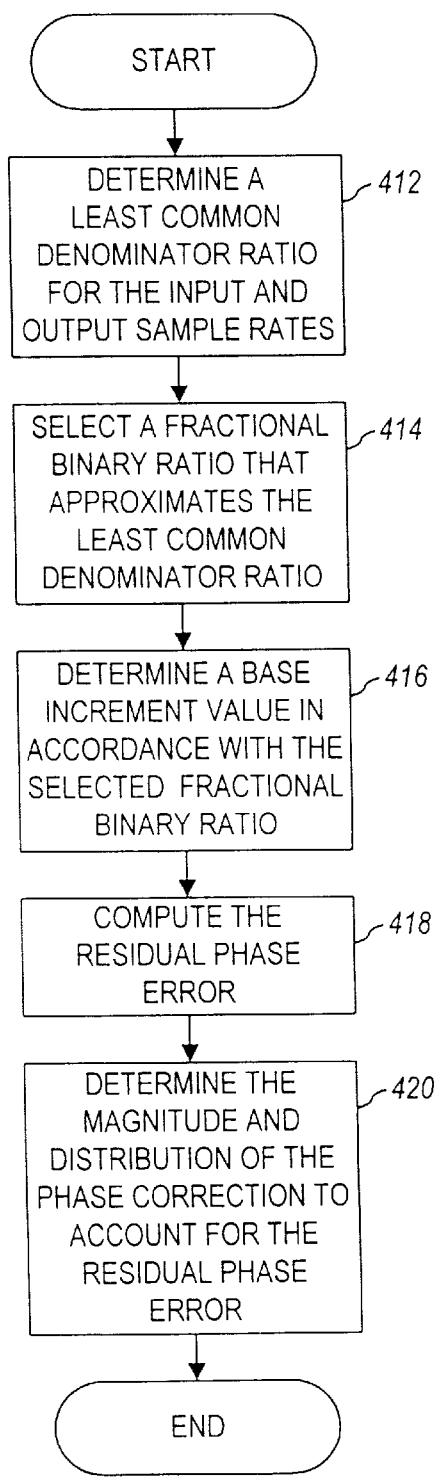
FIG. 4A shows a simplified flow diagram for generating sample rate conversion ratios using distributed jitter.

FIG. 4A shows a simplified flow diagram for generating sample rate conversion ratios using distributed jitter. Initially, a least common denominator ratio (m/n) is determined (at a step 412) for the input and output sample rates. This can be achieved by any manner known in the art, including the use of mathematical software that factors numbers. For the example above, the least common denominator ratio equals 160/147. The period of m input samples equals the period of n output samples.

Next, a fractional binary ratio (p/q) that approximates the least common denominator ratio is selected (at a step 414). This can be achieved by selecting a denominator value (q) equal to a power of two and determining a numerator value (p) that results in a ratio that closely approximates the least common denominator ratio. For the example above, denominator value (q) is selected to be 16384 and the fractional binary ratio is determined as p/q=17832/16384. The denominator value (q) corresponds to the period of the input clock, and the numerator value (p) approximates the period of the output clock. Once the fractional binary ratio is selected, a base increment value can be determined (at a step 416) as the numerator value (p) in the fractional binary ratio. For the above example, the base increment value p=17832.

A residual phase error is then computed (at a step 418). The residual phase error is the phase error accumulated over a repetition period that results from using the selected fractional binary ratio. The residual phase error can be computed as the difference between the repetition period and the accumulated phase using only the base increment value. The repetition period is the shortest period in which the input and output clock pattern repeats. The repetition period can be computed as the product of the input clock period (q) and the number of input clock cycles per repetition period. For the example above, the repetition period is 160·16384= 2621440. The accumulated phase for n output samples, using only the base increment value (p), can be computed as n·p. For the above example, the accumulated phase is 147·17832=2621304. The residual phase error can be calculated as (m·q−n·p). For the above example, the residual phase error equals 2621440−2621304=136.

Once the residual phase error is known, the magnitude and the distribution of the phase correction to account for the residual phase error is determined (at a step 420). In one embodiment, the magnitude of phase correction is limited to one LSB of jitter, to minimize the effects of the jitter on the output clock signal. However, larger magnitude of phase correction can also be used. The phase correction can be distributed in various manners, as described above. For example, the phase correction can be periodically, uniformly, or randomly distributed over the repetition period, or distributed in some other manners.

Figure 4B:
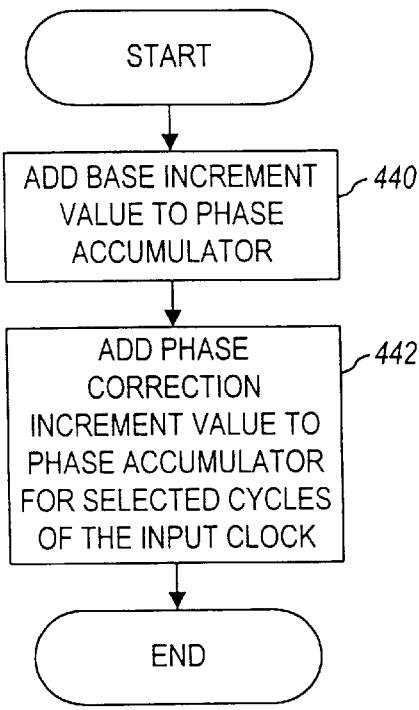
FIG. 4B shows a simplified flow diagram for using the base and fractional increment values to generate the required phase information.

FIG. 4B shows a simplified flow diagram for using the base and fractional increment values to generate the required phase information. For each cycle of the output clock signal, the base increment value (as determined in step 416) is added to the phase accumulator (at a step 440). For selected ones of the output clock cycles (as determined in step 420), a jitter corresponding to the fractional increment value (as determined in step 420) is added to the phase accumulator (at a step 442).

Referring back to FIG. 3, interpolator 310, resampler 330, phase accumulator 320, and phase increment generator 340 are each clocked by a respective clock signal. The clock signals for these elements can be the input clock, the output clock, or a combination of both input and output clocks. In a specific embodiment, all elements shown in FIG. 3 are clocked with the input clock. For each output clock cycle, or for selected cycles of the input clock, phase accumulator 320 updates the accumulated phase with a phase increment value from a phase increment generator 340.

Figure 5A:
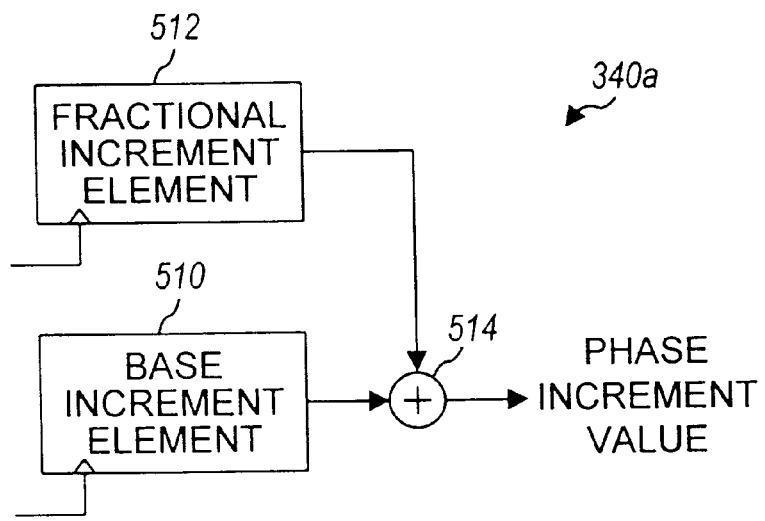
FIG. 5A shows a block diagram of an embodiment of a phase increment generator.

FIG. 5A shows a block diagram of an embodiment of a phase increment generator 340a. Phase increment generator 340a includes a base increment element 510 that contains the base increment value (p), and a fractional increment element 512 that generates or contains jitter corresponding to the fractional increment value. For the example described above, base increment element 510 would contain a value of 17832, and fractional increment element 512 would generate jitter for the fractional increment value of 136/147. Base increment element 510 and fractional increment element 512 can be implemented with registers, latches, memory elements, look-up tables, hardwired logic, or other circuits. The value from base increment element 510 and the jitter from fractional increment element 512 are provided to a summer 514 that adds the two inputs and provides the phase increment value to phase accumulator 320. For the example above, the phase value alternates between 17832 and 17833.

As described for the above example, the phase increment value is 17833 for 136 output clock cycles and 17832 for the other 11 output clock cycles. This can be achieved in various manners. For example, each repetition period can include ten instances where there are 13 cycles between the omission of one LSB of jitter, and one instance where there are 17 cycles between the omission of one LSB of jitter. This can be expressed as ((17833×12+17832×1)×10+(17833×16+17832×1)×1). Alternatively, each repetition period can include seven instances where there are 13 cycles between the omission of one LSB of jitter, and four instances where there are 14 cycles between the omission of one LSB of jitter. This can be expressed as ((17833×12+17832×1)×7+(17833×13+17832×1)×4). The seven instances of 13 cycles between the omission of one LSB of jitter and four instances of 14 cycles between the omission of one LSB of jitter can also be mixed to more uniformly distribute the jitter.

Figure 5B:
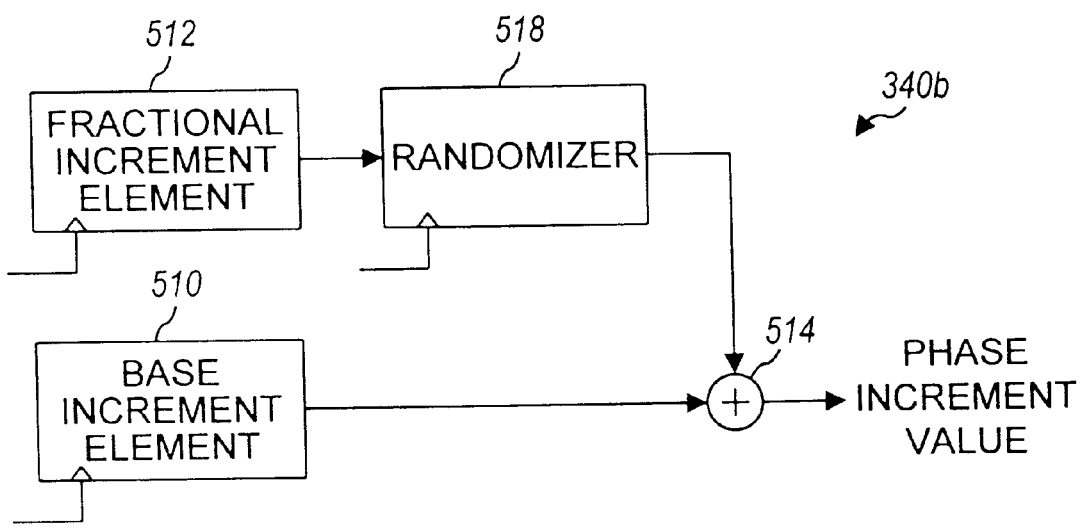
FIG. 5B shows a block diagram of an embodiment of a phase increment generator that randomly distributes jitter.

FIG. 5B shows a block diagram of an embodiment of a phase increment generator 340b that randomly distributes jitter. Phase increment generator 340b is similar to phase increment generator 340a in FIG. 5A, but further includes a randomizer 518 interposed between fractional increment element 512 and summer 514. Randomizer 518 distributes the jitter in a random (or pseudo-random) manner such that spurious tones in the output clock are substantially reduced or eliminated.

In one embodiment, randomizer 518 receives pairs of jitter for consecutive output clock cycles and, for each pair, randomly distributes the jitter. For jitter pairs of (1, 1) and (0, 0), randomizer 518 does nothing since jitter is introduced for both clock cycles for a jitter pair of (1, 1) and no jitter is introduced for a jitter pair of (0, 0). However, for jitter pairs of (1, 0) and (0, 1), randomizer 518 randomly selects one of two output clock cycles to add the jitter. The random selection can be performed in accordance with, for example, a random number generator or a pseudo-noise generator that are known in the art. Alternatively, jitter for more than two clock cycles (e.g., jitter for four clock cycles) can be grouped and randomly distributed. The randomization can also be performed in other manners, and this is within the scope of the invention.

Figure 5C:
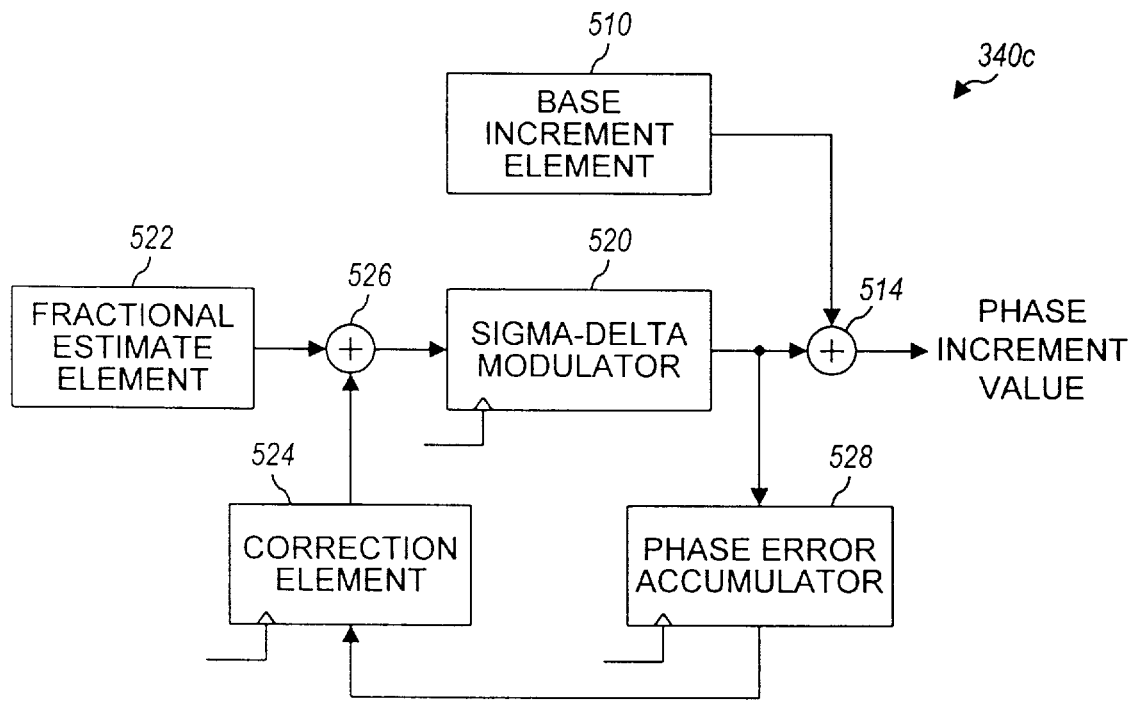
FIG. 5C shows a block diagram of an embodiment of a phase increment generator that uniformly and randomly distributes jitter.

FIG. 5C shows a block diagram of an embodiment of a phase increment generator 340c that supports uniform and pseudo-random jitter distribution. Phase increment generator 340c includes base increment element 510 and summer 514, similar to phase increment generator 340a in FIG. 5A. However, the jitter is generated by a sigmna-delta modulator 520 that uniformly and pseudo-randomly distributes the jitter.

Initially, the fractional increment value is approximated with a second fractional binary ratio (the first fractional binary ratio approximates the required sample rate conversion ratio). For the above example, the fractional increment value of 136/147 can be approximated as 236/256 (for use in conjunction with an 8-bit sigma-delta modulator). The estimated jitter value of 236 is then stored in a fractional estimate element 522. The estimated jitter value from fractional estimate element 522 and a correction value from a correction element 524 are provided to a summer 526 that adds the two inputs and provides the result to sigma-delta modulator 520. Sigma-delta modulator 520 generates jitter based on the value provided by summer 526.

A phase error accumulator 528 provides the correction value to correction element 524. For each repetition period, phase error accumulator 528 accumulates the jitter generated by sigma-delta modulator 520 and subtracts the required jitter amount. For the above example, phase error accumulator 528 accumulates the jitter and subtracts 136 from the accumulator for each repetition period (of 147 cycles of the output clock). After the subtraction, if the value in phase error accumulator 528 is greater than one (indicating that more jitter has been generated for the preceding repetition period than required), a small negative correction value (e.g., −1) is stored in correction element 524. Alternatively, if the value in phase error accumulator 528 is less than one (indicating that less jitter has been generated for the preceding repetition period than required), a small positive correction value (e.g., +1) is stored in correction element 524. And if the value in phase error accumulator 528 is zero (indicating that an exact amount of jitter has been generated for the preceding repetition period), a zero value is stored in correction element 524. Correction values other than (−1, 0, and +1) can be used and are within the scope of the present invention. The correction value in correction element 524 is changed once each repetition period.

The characteristics of the jitter generated by sigma-delta modulator 520 can be controlled, to an extent, by the use of sigma-delta modulators of different orders. A first order sigma-delta modulator is simplest to implement but does not distribute the jitter as "randomly" as higher order (e.g., second order) sigma-delta modulators. The implementation and characteristics of various sigma-delta modulators are known in the art and not described in detail herein. Sigma-delta modulators are described in detail by S. R. Norsworthy, R. Schreirer, and G. C. Temes in "The Delta-Sigma Data Converters," IEEE Press (ISDN 0-7803-1045-4), which is incorporated herein by reference.

Sigma-delta modulator 520 can also be used to generate a jitter "pattern" that is stored, for example, in fractional increment element 512 shown in FIGS. 5A and 5B.

Referring back to FIG. 3, resampler 330 provides selected ones of the interpolated samples from interpolator 310 as the output data. The determination of which interpolated samples to provide as the output data is made using the values from phase accumulator 320.

Figure 6:
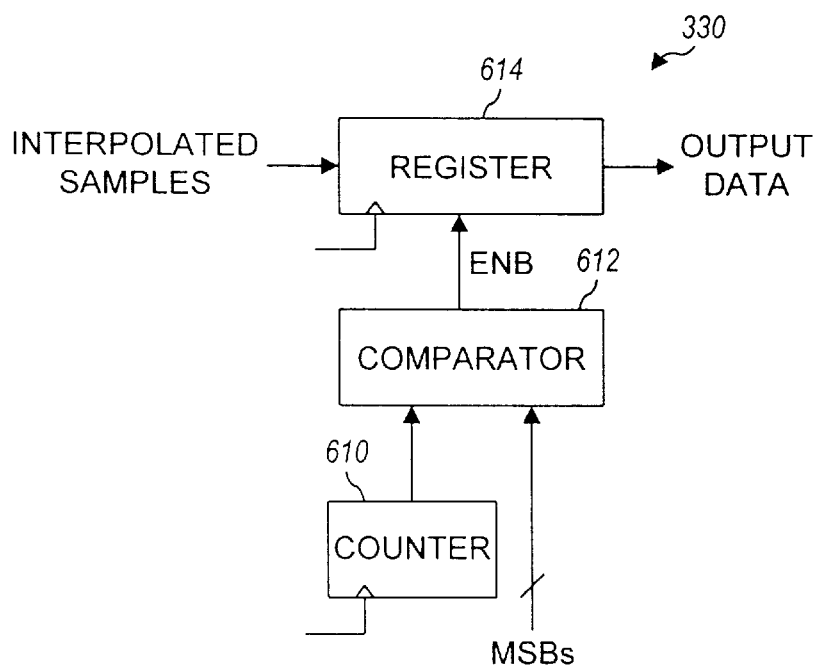
FIG. 6 shows a block diagram an embodiment of a resampler.

FIG. 6 shows a block diagram of an embodiment of a resampler 330. The input clock is used to trigger a counter 610. Counter 610 is implemented as a "wrap-around" counter. The output from counter 610 and the most significant bits (MSBs) from phase accumulator 320 are provided to a comparator 612. If the values are equal, comparator 612 provides the enable control signal (ENB) to a register 614. Register 614 receives the interpolated samples and, when enabled, provides the samples as the output data. The control signal (ENB) is also used to enable phase accumulator 320 in FIG. 3.

Similar to the elements in FIG. 3, the elements in FIGS. 5A–5C and FIG. 6 can be clocked with the input clock, the output clock, or a combination of both input and output clocks. In a specific embodiment, all elements shown in FIGS. 5A–5C and FIG. 6 are clocked with the input clock.

For the example described above, phase accumulator 320 can be implemented as a 17-bit accumulator, counter 610 can be implemented as a 3-bit counter, and three MSBs from phase accumulator 320 can be provided to comparator 612.

The previous description of the specific embodiments is provided to enable any person skilled in the art to make or use the invention. The various modifications to these embodiments will be readily apparent to those skilled in the art, and the generic principles defined herein may be applied to other embodiments without the use of the inventive faculty. Thus, the invention is not intended to be limited to the embodiments shown herein but is to be accorded the widest scope consistent with the principles and novel features disclosed herein, and as defined by the following claims.

What is claimed is:

1. A method for generating a sample rate conversion ratio using a sample rate converter, the method comprising:
    selecting a fractional binary ratio that approximates the sample rate conversion ratio;
    determining a residual phase error resulting from use of the selected fractional binary ratio;
    determining a predetermined amount of jitter that compensates for the residual phase error; and
    adding the predetermined amount of jitter to a phase accumulator.

2. The method of claim 1 wherein the jitter is periodically added to the phase accumulator over each repetition period.

3. The method of claim 1 wherein the jitter is approximately uniformly added to the phase accumulator over each repetition period.

4. The method of claim 1 wherein the jitter is substantially randomly added to the phase accumulator over each repetition period.

5. The method of claim 1 wherein the jitter is limited in amplitude to reduce the effects of the jitter.

6. The method of claim 5 wherein the jitter is limited in amplitude to one least significant bit (LSB) of the phase accumulator.

7. The method of claim 1 wherein the jitter is generated by a sigma-delta modulator.

8. A method for generating a sample rate conversion ratio using a sample rate converter, the method comprising:
    determining a least common denominator ratio for an input sample rate and an output sample rate;
    selecting a fractional binary ratio having a denominator that is a power of two;
    computing a residual phase error resulting from using the selected fractional binary ratio; and
    determining a magnitude and a distribution of a phase correction that accounts for the residual phase error.

9. The method of claim 8 further comprising:
    determining a base increment value in accordance with the selected fractional binary ratio.

10. The method of claim 9 wherein the residual phase error is computed as a phase difference, over a repetition period, between a required phase value and an accumulated phase value using the base increment value.

11. The method of claim 8 wherein the magnitude of the phase correction is limited to one least significant bit (LSB) of jitter.

12. The method of claim 8 wherein the phase correction is approximately uniformly distributed over each repetition period.

13. The method of claim 8 wherein the phase correction is substantially randomly distributed over each repetition period.

14. The method of claim 13 wherein the phase correction is achieved by randomly distributing pairs of jitter values.

15. The method of claim 8 wherein the fractional binary ratio is selected, for a given denominator, as a value closest to the least common denominator ratio.

16. A method for generating phases for a sample rate converter comprising:
    selecting a fractional binary ratio having a denominator that is a power of two, the fractional binary ratio representing an approximation of a required sample rate conversion ratio;
    computing a residual phase error from using the selected fractional binary ratio;
    determining a base increment value in accordance with the selected fractional binary ratio;
    determining a fractional increment value that accounts for the residual phase error;
    updating a phase accumulator with the base increment value for each cycle of an output clock; and
    updating the phase accumulator with a jitter value corresponding to the fractional increment value for selected cycles of the output clock.

17. A circuit for generating phases for sample rate conversion comprising:
    a phase accumulator; and
    a phase increment generator to generate a phase increment value for each cycle of an output clock, the phase increment value includes a base increment value and a fractional increment value selected to compensate for a residual phase error over a repetition period.

18. The circuit of claim 17 wherein the phase increment generator comprises:
    a base increment element to store the base increment value; and
    a fractional increment element to store the fractional increment value.

19. The circuit of claim 18 wherein the phase increment generator further comprises:
    a randomizer coupled to the fractional increment element.

20. The circuit of claim 18 wherein the magnitude of the phase correction is limited to one least significant bit (LSB) of jitter.

21. A method for performing a sample rate conversion using a sample rate converter, the method comprising:
    determining a base increment value in accordance with a fractional binary value that approximates a required sample rate conversion ratio;
    determining a fractional increment value that accounts for a residual phase error;
    generating a phase value for each output clock cycle in accordance with the base increment value and the fractional increment value;
    interpolating sampled data in accordance with the generated phase value; and
    providing selected ones of the interpolated samples as an output data.

22. The method of claim 21 wherein the generating a phase value is performed by adding jitter that corresponds to the fractional increment value;
    jitter is approximately uniformly added to the phase accumulator over each repetition period.

23. The method of claim 22 wherein the jitter is approximately uniformly added to the phase accumulator over each repetition period.

24. The method of claim 21 wherein the jitter is limited in amplitude to one least significant bit (LSB) of the phase accumulator.

* * * * *